(12) United States Patent
Kitamura

(10) Patent No.: US 6,730,961 B2
(45) Date of Patent: May 4, 2004

(54) SEMICONDUCTOR DEVICE

(75) Inventor: Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/322,369

(22) Filed: Dec. 18, 2002

(65) Prior Publication Data

US 2003/0122163 A1 Jul. 3, 2003

(30) Foreign Application Priority Data

Dec. 18, 2001 (JP) ........................................ 2001-384921

(51) Int. Cl.[7] ............................................. H01L 31/119
(52) U.S. Cl. ........................ 257/330; 257/329; 257/331; 438/259; 438/270
(58) Field of Search ................................. 257/330, 329, 257/327, 326; 438/259, 270, 271, 589

(56) References Cited

U.S. PATENT DOCUMENTS

| 5,844,275 A | 12/1998 | Kitamura et al. ............ 257/335 |
| 2001/0041419 A1 | 11/2001 | Ito .............................. 438/424 |
| 2001/0055861 A1 | 12/2001 | Patti et al. ................... 438/524 |
| 2002/0115270 A1 | 8/2002 | Wu ............................. 438/484 |
| 2002/0197782 A1 * | 12/2002 | Kitamura .................... 438/200 |
| 2003/0001202 A1 * | 1/2003 | Kitamura .................... 257/330 |

FOREIGN PATENT DOCUMENTS

| JP | 61-260676 | 11/1986 |
| JP | 64-51662 | 2/1989 |
| JP | 2-180074 | 7/1990 |
| JP | 3-4560 | 1/1991 |
| JP | 3-44076 | 2/1991 |
| JP | 5-110072 A | 4/1993 |
| JP | 5-190663 A | 7/1993 |
| JP | 5-299648 | 11/1993 |
| JP | 6-97450 | 4/1994 |
| JP | 7-74352 | 3/1995 |
| JP | 9-321291 A | 12/1997 |
| JP | 11-238791 A | 8/1999 |
| JP | 2000-150877 | 5/2000 |
| JP | 2001-036071 A | 2/2001 |

* cited by examiner

Primary Examiner—Dung A. Le
(74) Attorney, Agent, or Firm—Rossi & Associates

(57) ABSTRACT

A semiconductor device includes trench lateral MOSFET's, each trench lateral MOSFET includes a trench; an oblong $n^+$-type source region; an oblong $n^+$-type drain regions; and an $n^-$-type offset drain region; the direction parallel to the short edge portions of $n^+$-type source region and $n^+$-type drain region being defined as an x-direction; the direction perpendicular to the x-direction being defined as a y-direction; $n^-$-type offset drain region surrounding the short edge portions, extending in the x-direction, of $n^+$-type drain region 7 such that the offset drain length in the y-direction is longer than the offset drain length in the x-direction along the side walls and the bottom wall of trench to secure a sufficient offset drain length in the y-direction and to relax the electric field localization to the short edge portion, extending in the x-direction, of $n^+$-type drain region.

12 Claims, 5 Drawing Sheets

SEMICONDUCTOR DEVICE

BACKGROUND

The present invention relates to a semiconductor devices. Specifically, the present invention relates to a semiconductor devices including MOSFET's that exhibit a high breakdown voltage and used in power IC's.

Recently, so-called trench MOSFET's, which include a gate electrode buried in a trench so that a channel may be formed along the side wall of the trench, have been developed. The trench MOSFET is advantageous to reduce the cell pitch and the on-resistance per a unit area. Although some trench lateral MOSFET structures for power IC's have been proposed or reported, the proposed or reported trench lateral MOSFET's have not been used practically for power IC's yet.

The proposed trench lateral MOSFET's include a top-drain-trench RESURF (reduced surface electric field) DMOS transistor, which includes a trench formed between a source and a drain and a gate formed in the trench (cf. Japanese Unexamined Laid Open Patent Application H06-97450). Another proposed trench gate structure includes a polysilicon gate electrode buried in a trench in the same way as the top-drain-trench RESURF DMOS transistor described above (cf. ISPSD' 2000, pp. 47–50).

A lateral power transistor reported includes a source, a drain and a trench formed in the surface portion of a substrate, and a gate formed on the surface of the region between the source and the trench, therein a channel is formed (cf. Japanese Unexamined Laid Open Patent Application H07-74352).

The present inventors have proposed a transistor including a trench dug from the surface of an offset drain region, an insulator or a semi-insulator filling the trench and a gate electrode extended above the trench (cf. Japanese Unexamined Laid Open Patent Application H08-97411).

For manufacturing the transistor disclosed in Japanese Unexamined Laid Open Patent Application H06-97450, it is necessary to form an oxide layer, the thickness thereof is nonuniform, by selectively oxidizing an oxide film formed on the inner walls of a trench, to form a gate oxide film by wet-etching the thin portion of the nonuniform oxide layer, and to fill the trench with a polysilicon gate electrode. Therefore, the manufacturing process for manufacturing the transistor disclosed in Japanese Unexamined Laid Open Patent Application H06-97450 is complicated and includes too many steps.

The breakdown voltage of the trench gate transistor having the trench gate structure reported in ISPSD' 2000 is not higher than 20 V to reduce the channel resistance. The trench gate structure reported in ISPSD' 2000 is not adequate to obtain a transistor exhibiting a breakdown voltage of the several hundreds volt class, since any field plate effect is not obtained by the source electrode and the drain electrode thereof as the top plan view thereof shown in FIG. 1 of the above described report indicates.

The structure disclosed in Japanese Unexamined Laid Open Patent Application H07-74352 is not adequate to obtain a transistor exhibiting a breakdown voltage of 200 V or higher, since any field plate effect is not obtained by the source electrode and the drain electrode thereof as the structure shown in FIG. 2 of the above described patent publication indicates.

The gate electrode extended above the trench in the transistor disclosed in Japanese Unexamined Laid Open Patent Application H08-97411 is expected to exhibit a field plate effect. However, the transistor disclosed in Japanese Unexamined Laid Open Patent Application H08-97411 is not adequate to obtain a breakdown voltage of 200 V or higher, since any field plate effect is not obtained by the source electrode and the drain electrode thereof as the structure shown in FIG. 1 of the above described patent publication indicates.

In view of the foregoing, it would be desirable to provide a semiconductor device structure, which facilitates improving the breakdown voltages in the edge portions of the source and the drain by relaxing the electric field localization to the edge portions of the source and the drain, obtaining a breakdown voltage of several hundreds V, easy manufacture thereof without adding many manufacturing steps, and including trench lateral MOSFET's exhibiting a high breakdown voltage.

SUMMARY OF THE INVENTION

According to a first aspect of the invention, there is provided a semiconductor device including: a semiconductor substrate of a first conductivity type; unit devices in the surface portion of the semiconductor substrate; each of the unit devices including: an oblong trench dug from the surface of the substrate; an oblong source region of a second conductivity type in the surface portion of the semiconductor substrate, the source region being spaced apart from the trench; an offset drain region of the second conductivity type formed along the surface of the substrate spaced apart from the source region, along the side wall of the trench and along the bottom wall of the trench; an oxide filling the trench; an oblong drain region of the second conductivity type in the surface portion of the semiconductor substrate facing to the source region across the trench; a gate insulation film on the surface portion of the semiconductor substrate between the source region and the offset drain region; a gate electrode on the gate insulation film; a source electrode connected electrically to the source region; a drain electrode connected electrically to the drain region; the direction along the long edge portion of the drain region in the planar layout of the semiconductor device being defined as a y-direction; the direction perpendicular to the x-direction in the planar layout of the semiconductor device being defined as an x-direction; the trench being extended in the y-direction from the short edge portions, extending in the x-direction, of the drain region; and the short edge portions, extending in the x-direction, of the drain region being surrounded by the offset drain region. The unit device having the structure described above is a trench lateral MOSFET exhibiting a high breakdown voltage of several hundred volts (V).

Advantageously, the length of the offset drain region in the y-direction between the edge portion, extending in the x-direction, of the trench and the short edge portion, extending in the x-direction, of the drain region is longer than the length of the offset drain region in the x-direction between an adjacent pair of the trench in the planar layout of the semiconductor device.

Advantageously, the semiconductor device further includes a base region of the first conductivity type formed in the surface portion of the semiconductor substrate, and the base region surrounds the source region formed therein and the offset drain region in the planar layout of the semiconductor device.

According to a second aspect of the invention, there is provided a semiconductor device including: a semiconductor substrate of a first conductivity type; unit devices in the surface portion of the semiconductor substrate; each of the unit devices including: a trench dug from the surface of the substrate, the trench being shaped with a ring, the trench being shared by a pair of the unit devices; a source region of a second conductivity type in the surface portion of the semiconductor substrate, the source region surrounding the trench, the source region being spaced apart from the trench; an offset drain region of the second conductivity type formed along the surface of the substrate spaced apart from the source region, along the side wall of the trench and along the bottom wall of the trench; an oxide filling the trench; a drain region of the second conductivity type in the surface portion of the semiconductor substrate facing to the source region across the trench and surrounded by the trench; a gate insulation film on the surface portion of the semiconductor substrate between the source region and the offset drain region; a gate electrode on the gate insulation film; a source electrode connected electrically to the source region; and a drain electrode connected electrically to the drain region. The unit device having the structure described above is a trench lateral MOSFET exhibiting a high breakdown voltage of several hundreds V.

Advantageously, the direction along the long edge portion of the drain region in the planar layout of the semiconductor device is defined as a y-direction; the direction perpendicular to the x-direction in the planar layout of the semiconductor device is defined as an x-direction; and the trench is wider in the y-direction than in the x-direction.

Advantageously, the direction along the long edge portion of the drain region in the planar layout of the semiconductor device is defined as a y-direction; the direction perpendicular to the y-direction in the planar layout of the semiconductor device is defined as an x-direction; and the offset drain region is formed between the drain region and the trench in the y-direction in the planar layout of the semiconductor device.

Advantageously, the length of the offset drain region between the drain region and the gate electrode is longer in the y-direction than in the x-direction.

Advantageously, the semiconductor device further includes a base region of the first conductivity type formed in the surface portion of the semiconductor substrate, and the base region surrounds the source region formed therein.

The structures described above facilitates securing a sufficient offset drain length in the y-direction and relaxing the electric field localization to the edge portion, extending in the x-direction, of the drain region.

Advantageously, the base region includes an oblong branch extended in the y-direction between the adjacent source regions of adjacent pairs of the unit devices; the edge portion, extending in the x-direction, of the distal end of the branch and the inner short edge portions, extending in the x-direction, of the adjacent gate electrodes of the adjacent pairs of the unit devices are surrounded by the offset drain region in the planar layout of the semiconductor device.

Since the electric field localization to the edge portion, extending in the x-direction, of the source region is relaxed and the potential of the region below the portion of the drain electrode, thereto a bonding wire is bonded, is kept at the drain potential, the electric field applied to the interlayer insulation film is relaxed.

DETAILED DESCRIPTION OF THE PREFERRED EMBODIMENTS

The invention will now be described with reference to certain preferred embodiments thereof and the accompany drawings, wherein.

DETAILED DESCRIPTION OF THE PREFERRED EMBODIMENTS

The invention will be described in detail hereinafter with reference to the accompanied drawing figures which illustrate the preferred embodiments of the invention. The accompanied drawing figures do not always describe the constituent elements at a magnifying power exactly representing the dimensions of the constituent elements appended in the figures. Although the first conductivity type is a p-type and the second conductivity type is an n-type in the following descriptions, the invention is applicable to the semiconductor devices, in which the first conductivity type is an n-type and the second conductivity type is a p-type.

First Embodiment

Figure 1:
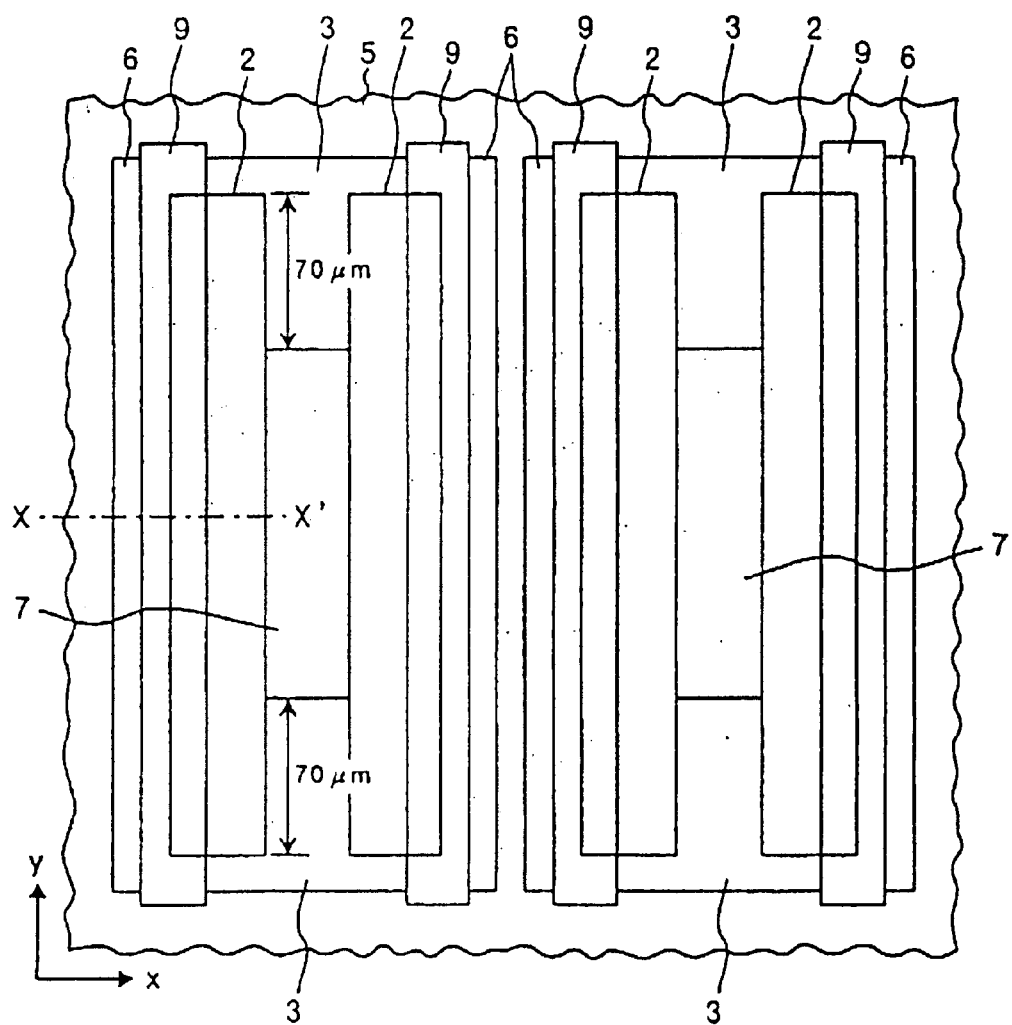
FIG. 1 is a top plan view showing the planar layout of a semiconductor device according to the first embodiment of the invention.
Figure 2:
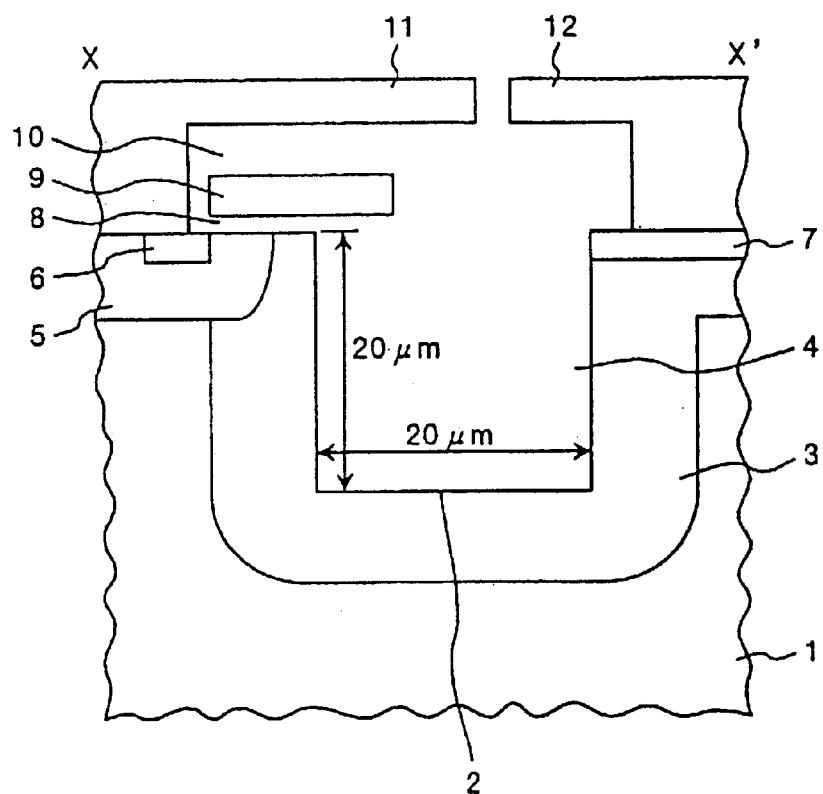
FIG. 2 is a cross section along the line segment X–X' of FIG. 1.

FIG. 1 is a top plan view showing the planar layout of a semiconductor device according to a first embodiment of the invention. FIG. 2 is a cross section along the line segment X–X' of FIG. 1. In FIG. 1, four trench lateral MOSFET's, each exhibiting a high breakdown voltage, are shown. In FIG. 1, source electrodes, drain electrodes, interlayer oxide films and passivation films positioned on the upper side of gate electrodes are omitted.

First, the cross sectional structure of the semiconductor device according to the first embodiment will be described with reference to FIG. 2. The semiconductor device shown in FIG. 2 is a trench lateral MOSFET including a p-type semiconductor substrate 1, a trench 2, an $n^-$-type offset drain region 3, an oxide 4 such as $SiO_2$ filling trench 2, a p-type base region 5, an $n^+$-type source region 6, an $n^+$-type drain region 7, a gate oxide film 8, a polysilicon gate electrode 9, an interlayer oxide film 10, a source electrode 11, a drain electrode 12, and a not shown passivation film.

Trench 2 in the surface portion of semiconductor substrate 1 is dug from the surface of semiconductor substrate 1 and filled with oxide 4. The $n^-$-type offset drain region 3 surrounds the side wall and the bottom wall of trench 2. The p-type base region 5 contacts with the surface portion of $n^-$-type offset drain region 3 on the source side of trench 2. The $n^+$-type source region 6 is in the surface portion of p-type base region 5 and spaced apart from $n^-$-type offset drain region 3 for p-type base region 5. The $n^+$-type drain region 7 is in the surface portion of $n^-$-type offset drain region 3 on the drain side of trench 2 (facing to the source side across trench 2).

Gate oxide film 8 is on $n^+$-type source region 6 and the source-side surface portion of $n^-$-type offset drain region 3. Polysilicon gate electrode 9 is on gate oxide film 8 and extended above trench 2. Interlayer oxide film 10 covers polysilicon gate electrode 9 and the portion of the semiconductor device above trench 2. Source electrode 11 is connected electrically to p-type base region 5 and $n^+$-type source region 6 and extended above trench 2 along interlayer oxide film 10.

Drain electrode 12 is connected electrically to n+-type drain region 7 and extended above trench 2 along interlayer oxide film 10. Source electrode 11 and drain electrode 12 are spaced apart and insulated form each other. The portion of n−-type offset drain region 3 along the side wall of trench 2, the portion thereof along the bottom wall of trench 2 and the portion thereof along the surface portion of substrate 1 are formed through one diffusion step. Alternatively, the portion of n−-type offset drain region 3 along the side wall of trench 2, the portion thereof along the bottom wall of trench 2 and the portion thereof along the surface portion of substrate 1 may be formed through the respective diffusion steps.

Exemplary, the specific resistance of semiconductor substrate 1 is 100 Ωcm. Trench 2 is 20 μm in width and in depth. The side wall of trench 2 and the substrate surface cross at 90 degrees of angle. The surface impurity concentration of n−-type offset drain region 3 is from $5 \times 10^{15}$ cm$^{-3}$ to $5 \times 10^{16}$ cm$^{-3}$. The n−-type offset drain region 3 is from 3 μm to 8 μm in depth. Polysilicon gate electrode 9, source electrode 11 and drain electrode 12 extend 5 μm, 10 μm and 5 μm, respectively, above trench 2. Polysilicon gate electrode 9, source electrode 11 and drain electrode 12 formed as described above work as field plates, respectively.

Now the planar layout of the semiconductor device according to the first embodiment will be described with reference to FIG. 1. For the convenience of description, the direction along the line segment X–X' of FIG. 1 is defined as an x-direction and the direction perpendicular to the x-direction (the vertical direction of the figure) as a y-direction. The n+-type source region 6 and n+-type drain region 7 are extended along the y-direction and arranged in parallel to each other in the x-direction. Trenches 2 are also extended also along the y-direction and arranged in parallel to each other in the x-direction. The edge portions, extending in the x-direction, of n+-type drain region 7, i.e. the both short edge portions of n+-type drain region 7, are positioned inside and spaced part for 70 μm from the short edge portions, extending in the x-direction, of trench 2. In the y-direction, the n−-type offset drain region 3 is in the surface portions of the substrate and extended to the short edge portions, extending in the x-direction, of n+-type drain region 7.

In the vertical cross section containing the line segment X–X' and perpendicular to the plane of paper, the structure of the third trench lateral MOSFET from the left hand side of the figure is the same with the above described structure of the first trench lateral MOSFET (leftmost trench lateral MOSFET). In the vertical cross section containing the line segment X–X' and perpendicular to the plane of paper, the structure of the second and fourth trench lateral MOSFET's from the left hand side of the figure is a mirror image of the corresponding structure in the trench lateral MOSFET on the left hand side thereof.

Due to the structures described above, a depletion layer expands from the junction portion between p-type base region 5 and n−-type offset drain region 3 along the side wall and the bottom wall of trench 2. The offset drain length in the x-direction is 60 μm (20 μm+20 μm+20 μm). Since the edge portions of n+-type drain region 7 are positioned inward, e.g. by 70 μm, from the respective edge portions of trench 2 as described above, the offset drain length in the y-direction is 70 μm, which is long enough to relax the electric field localization to the edge portion, extending in the x-direction, of n+-type drain region 7. The above described structure of the semiconductor device according to the first embodiment facilitates providing a breakdown voltage of around 700 V.

Now the method of manufacturing the semiconductor device described in FIGS. 1 and 2 will be described briefly below.

A trench 2, 20 μm in width and 20 μm in depth, is formed by photo-etching in the surface portion of a p-type semiconductor substrate 1, the specific resistance thereof is 100 Ωcm. After depositing doped n-type polysilicon in trench 2, an n−-type offset drain region 3, the surface impurity concentration thereof is from $5 \times 10^{15}$ cm$^{-3}$ to $5 \times 10^{16}$ cm$^{-3}$ and the diffusion depth (xj) thereof is from 3 μm to 8 μm, is formed uniformly along the side wall and the bottom wall of trench 2 by diffusing the n-type impurity in the doped n-type polysilicon from the inner surface of trench 2 by heat treatment. Then, the polysilicon in trench 2 is removed by etching and an oxide film, which will be an oxide 4, is deposited in trench 2.

Then, a gate oxide film 8 is formed, polysilicon layer is deposited on gate oxide film 8 and a polysilicon gate electrode 9 is formed by photo-etching the deposited polysilicon layer. Polysilicon gate electrode 9 is extended above trench 2 for 5 μm. Then, a p-type base region 5 and an n+-type source region 6 are formed in the surface portion of substrate 1. Simultaneously with or independently of forming n+-type source region 6, an n+-type drain region 7 is formed in the surface portion of n−-type offset drain region 3 on the other side of trench 2. As described above, n+-type drain region 7 is formed such that the edge portions of n+-type drain region 7 are positioned inward, e.g. by 70 μm, from the respective edge portions of trench 2 in the y-direction. After depositing an interlayer insulation film 10, a source electrode 11 and a drain electrode 12 are formed such that source electrode 11 extends for 10 μm above trench 2 and drain electrode 12 extends for 5 μm above trench 2. Finally, a not shown passivation film is coated on the structure formed so far. Thus, the semiconductor device according to the invention is manufactured by adding the step of forming a trench 2 and the step of filling trench 2 with an oxide 4 to the steps for manufacturing the conventional lateral DMOSFET. The method of manufacturing the semiconductor device according to the first embodiment of the invention does not include any difficult step.

According to the first embodiment of the invention, the electric field localization to the edge portion, extending in the x-direction, of n+-type drain region 7 is relaxed, since the edge portions, extending in the x-direction, of n+-type drain region 7 are positioned more closely to the center of the device than the edge portions, extending in the x-direction, of trench 2 and n−-type offset drain region 3 is extended for a sufficient length in the y-direction from the edge portion, extending in the x-direction, of n+-type drain region 7. The breakdown voltage of the device determined by the structure of the active region including the source region and the drain region, that is the breakdown voltage determined by the offset drain length in the x-direction, is not affected adversely by the breakdown voltage in the edge portion, extending in the y-direction, of n+-type drain region 7 by elongating the offset drain length in the y-direction. Thus, the breakdown voltage of the device is improved and a semiconductor device including trench lateral MOSFET's exhibiting a high breakdown voltage, e.g. 700 V, is obtained without adding many manufacturing steps. Since the breakdown voltage of the device is determined by the structure of the active region including the source region and the drain region, the avalanche withstanding capability of the semiconductor device is improved according to the first embodiment of the invention.

Second Embodiment

Figure 3:
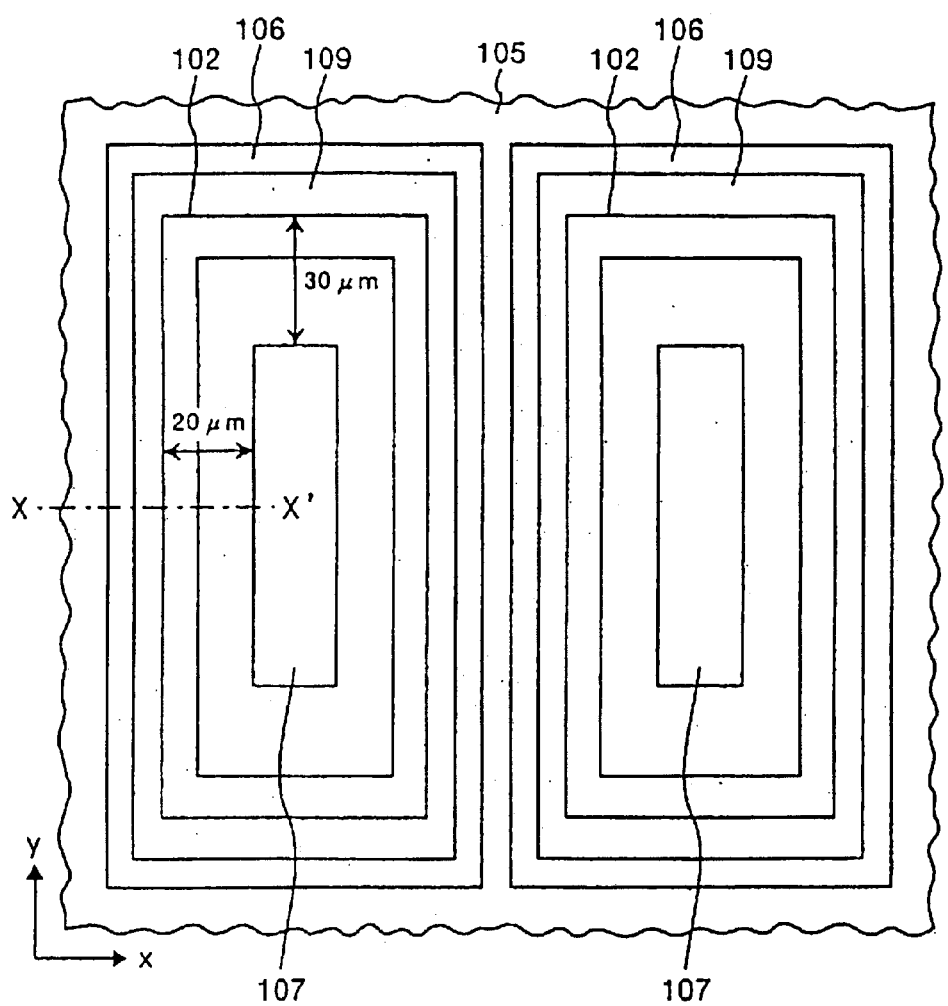
FIG. 3 is a top plan view showing the planar layout of a semiconductor device according to the second embodiment of the invention.

FIG. 3 is a top plan view showing the planar layout of a semiconductor device according to a second embodiment of the invention. In FIG. 3, four trench lateral MOSFET's, each exhibiting a high breakdown voltage, are shown. In the figure, source electrodes, drain electrodes, interlayer oxide films and passivation films positioned on the upper side of gate electrodes are omitted. For the sake of convenience, an x-direction and a y-direction are defined in FIG. 3 in the same way as in FIG. 1.

Referring now to FIG. 3, an $n^+$-type drain region 107 is surrounded by a trench 102. In other words, trenches 102 and 102 for a pair of trench lateral MOSFET's are continuous to each other and an $n^+$-type drain region 107 is formed like an island in trench 102. Exemplary, trench 102 is 20 $\mu$m in width in the x-direction, and a little bit wider, e.g. 30 $\mu$m in width, in the y-direction. In the same manner as trench 2, polysilicon gate electrodes 109 and 109 and $n^+$-type drain regions 106 and 106 for the pair of trench lateral MOSFET's having $n^+$-type drain region 107 commonly are continuous to each other, respectively.

In FIG. 3, the cross sectional structure of the third trench lateral MOSFET from the left hand side of the figure is the same with the cross sectional structure of the first trench lateral MOSFET (leftmost trench lateral MOSFET). The cross sectional structure of the second and fourth trench lateral MOSFET's from the left hand side of the figure is a mirror image of the cross sectional structure in the trench lateral MOSFET on the left hand side thereof.

Due to the structures described above, the offset drain length in the y-direction is 70 $\mu$m (20 $\mu$m+30 $\mu$m+20 $\mu$m) and the offset drain length in the x-direction is 60 $\mu$m (20 $\mu$m+30 $\mu$m+20 $\mu$m). Since the offset drain length in the y-direction is longer than the offset drain length in the x-direction, the electric field localization to the edge portion, extending in the x-direction, of $n^+$-type drain region 107 is relaxed. The above described structure of the semiconductor device according to the second embodiment facilitates providing a breakdown voltage of around 700 V.

Since the cross sectional structure along the line segment X–X' in FIG. 3 is similar to that shown in FIG. 2, the cross sectional structure along the line segment X–X' in FIG. 3 is described in the same way as that in FIG. 2 by substituting a trench 102 for trench 2 in FIG. 2, a p-type base region 105 for p-type base region 5, an $n^+$-type source region 106 for $n^+$-type source region 6, an $n^+$-type drain region 107 for $n^+$-type drain region 7, and a polysilicon gate electrode 109 for polysilicon gate electrode 9. Since the semiconductor device according to the second embodiment is manufactured by changing the mask patterns for manufacturing the semiconductor device according to the first embodiment appropriately, the descriptions on the manufacture of the semiconductor device according to the second embodiment are omitted to avoid duplication.

Since the electric field localization to the edge portion, extending in the x-direction, of $n^+$-type drain region 107 is relaxed according to the second embodiment, a semiconductor device including trench lateral MOSFET's exhibiting a high breakdown voltage, e.g. 700 V, is obtained in the same way as according to the first embodiment without adding many manufacturing steps. The semiconductor device according to the second embodiment exhibits an improved avalanche withstanding capability.

Third Embodiment

Figure 4:
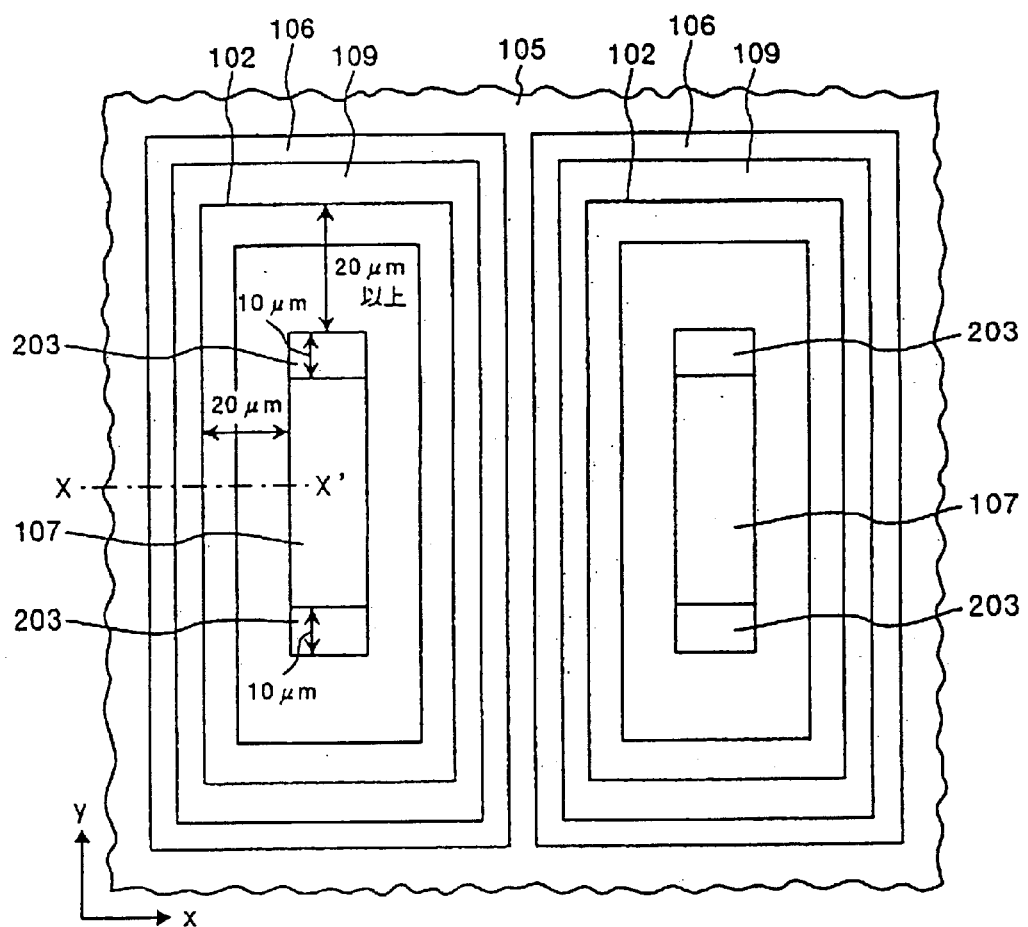
FIG. 4 is a top plan view showing the planar layout of a semiconductor device according to the third embodiment of the invention.

FIG. 4 is a top plan view showing the planar layout of a semiconductor device according to a third embodiment of the invention. In FIG. 4, four trench lateral MOSFET's, each exhibiting a high breakdown voltage, are shown. In the figure, source electrodes, drain electrodes, interlayer oxide films and passivation films positioned on the upper side of gate electrodes are omitted. For the sake of convenience, an x-direction and a y-direction are defined in FIG. 4 in the same way as in FIG. 1.

In the planar layout of a semiconductor device according to the third embodiment shown FIG. 4, the width of a trench 102 is 20 $\mu$m or wider in the y-direction and $n^-$-type offset drain regions 203 and 203 are formed between trench 102 and the edge portions, extending in the x-direction, of an $n^+$-type drain region 107. The length of $n^-$-type offset drain regions 203 in the y-direction is 10 $\mu$m. The trench width is 20 $\mu$m in the x-direction in the same manner as according to the second embodiment.

In FIG. 4, the cross sectional structure of the third trench lateral MOSFET from the left hand side of the figure is the same with the cross sectional structure of the first trench lateral MOSFET (leftmost trench lateral MOSFET). The cross sectional structure of the second and fourth trench lateral MOSFET's from the left hand side of the figure is a mirror image of the cross sectional structure in the trench lateral MOSFET on the left hand side thereof.

Although only a part of the offset drain regions is shown in FIG. 4, the offset drain length in the x-direction is 60 $\mu$m (20 $\mu$m+30 $\mu$m+20 $\mu$m) and the offset drain length in the y-direction is 70 $\mu$m (10 $\mu$m+20 $\mu$m+20 $\mu$m+20 $\mu$m). Since the offset drain length in the y-direction is longer than the offset drain length in the x-direction, the electric field localization to the edge portion, extending in the x-direction, of $n^+$-type drain region 107 is relaxed. The above described structure of the semiconductor device according to the third embodiment facilitates providing a breakdown voltage of around 700 V.

Since the cross sectional structure along the line segment X–X' in FIG. 4 is similar to that shown in FIG. 2, the cross sectional structure along the line segment X–X' in FIG. 4 is described in the same way as that in FIG. 2 by substituting a trench 102 for trench 2 in FIG. 2, a p-type base region 105 for p-type base region 5, an $n^+$-type source region 106 for $n^+$-type source region 6, an $n^+$-type drain region 107 for $n^+$-type drain region 7, and a polysilicon gate electrode 109 for polysilicon gate electrode 9. Since the semiconductor device according to the third embodiment is manufactured by changing the mask patterns for manufacturing the semiconductor device according to the first embodiment appropriately, the descriptions on the manufacture of the semiconductor device according to the third embodiment are omitted to avoid duplication.

Since the electric field localization to the edge portion, extending in the x-direction, of $n^+$-type drain region 107 is relaxed according to the third embodiment, a semiconductor device including trench lateral MOSFET's exhibiting a high breakdown voltage, e.g. 700 V, is obtained in the same way as according to the first and second embodiments without adding many manufacturing steps. The semiconductor device according to the third embodiment exhibits an improved avalanche withstanding capability.

Fourth Embodiment

Figure 5:
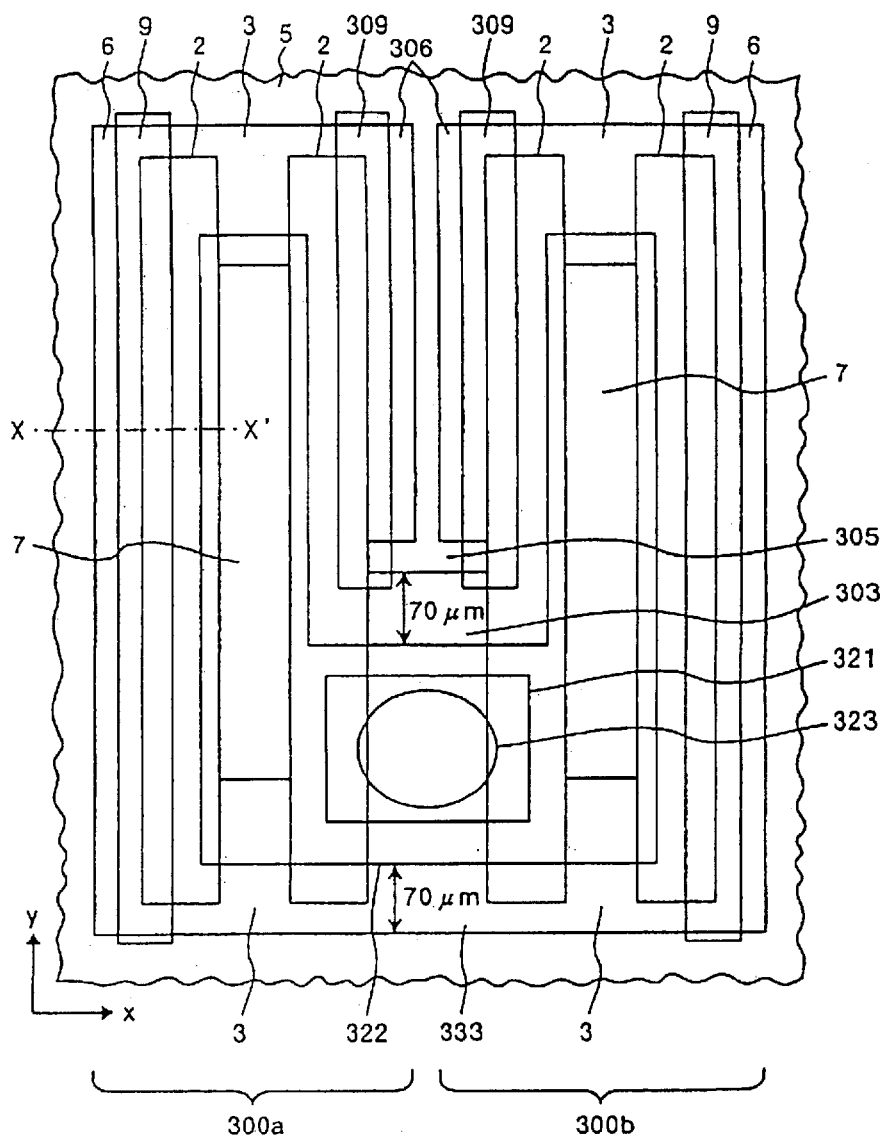
FIG. 5 is a top plan view showing the planar layout of a semiconductor device according to the fourth embodiment of the invention.

FIG. 5 is a top plan view showing the planar layout of a semiconductor device according to a fourth embodiment of the invention. In FIG. 5, four trench lateral MOSFET's, each exhibiting a high breakdown voltage, are shown. In the figure, source electrodes, drain electrodes, interlayer oxide films and passivation films positioned on the upper side of gate electrodes are omitted. For the sake of convenience, an x-direction and a y-direction are defined in FIG. 5 in the same way as in FIG. 1.

The planar layout shown in FIG. 5 includes a pair of trench lateral MOSFET's 300a commonly having an n+-type drain region 7 and a pair of trench lateral MOSFET's 300b commonly having another n+-type drain region 7. The pair of trench lateral MOSFET's 300a includes a short n+-type source region 306 and a short polysilicon gate electrode 309. The pair of trench lateral MOSFET's 300b includes another short n+-type source region 306 and another short polysilicon gate electrode 309. Short n+-type source regions 306 and 306 and short polysilicon gate electrodes 309 and 309 are facing to each other, respectively. A pad opening 321 for drain electrode is formed above the region left due to short n+-type source regions 306 and 306 and short polysilicon gate electrodes 309 and 309.

The short edge portions of n+-type source regions 306 and 306 on the side of pad opening 321 are surrounded by a p-type base region 305 (a branch portion) extended from a p-type base region 5 in the peripheral portion of the semiconductor device. In the surface portion of the substrate between p-type base region 305 and p-type base region 5, n−-type offset drain regions 333 and 303, each extended from the portion of n−-type offset drain region 3 between n+-type drain region 7 and p-type base region 5, are formed. A drain electrode 322 is above trenches 2 and 2 and n−-type offset drain regions 3, 303 and 333 with an interlayer insulation film (oxide film) interposed therebetween.

Drain electrode 322 includes two branches extended along n+-type drain regions 7 and 7. An end of one of the drain electrode branches and an end of the other drain electrode branch are connected to each other via a connection portion such that drain electrode 322 is shaped with a letter U. Drain pad opening 321 (bored through the passivation film) is formed in the connection portion of drain electrode 322 (the bottom portion of the letter U), and a bonding wire 323 is crimped to drain pad opening 321. Exemplary, the portion of drain electrode 322, in which pad opening 321 is formed, and p-type base region 305 surrounded by n+-type source regions 6 and 6 facing to each other are spaced apart for 70 μm. Exemplary, the portion of drain electrode 322, in which pad opening 321 is formed, and p-type base region 5 are spaced apart for 70 μm.

Along the line segment X–X' in FIG. 5, the cross sectional structure of the fourth trench lateral MOSFET from the left hand side of the figure is the same with the cross sectional structure of the first trench lateral MOSFET (leftmost trench lateral MOSFET). Along the line segment X–X' in FIG. 5, the cross sectional structure of the second and fourth trench lateral MOSFET's from the left hand side of the figure is a mirror image of the cross sectional structure in the trench lateral MOSFET on the left hand side thereof.

Since the cross sectional structure along the line segment X–X' in FIG. 5 is similar to that shown in FIG. 2, the descriptions on the cross sectional structure along the line segment X–X' in FIG. 5 are omitted. The semiconductor device according to the fourth embodiment is manufactured by changing the mask patterns for manufacturing the semiconductor device according to the first embodiment appropriately, by forming drain electrode 322 and pad opening 321 using the conventional techniques and by forming the wire bonding. Therefore, the detailed descriptions on the method of manufacturing the semiconductor device according to the fourth embodiment are omitted.

The structure described above is employed because it is impossible to form a drain electrode above the source region, the base region and the gate electrode, when it is required for the interlayer breakdown voltage between the metal and the substrate to be 1000 V and it is required for the voltage between the source and the drain to be 300 V or higher. The structure described above is employed also because it is impossible for the cross sectional structure shown in FIG. 2, therein the pitch between the source and the drain is 30 μm, to form wire bonding on the drain line. Due to these reasons, the region, therein pad opening 321 for the drain electrode is formed, is formed in adjacent to the end portion of the short source regions according to the fourth embodiment.

According to the fourth embodiment, the electric fields in the edge portions, extending in the x-direction, of n+-type source region 306 of the pair of trench lateral MOSFET's 300a and n+-type source region 306 of the pair of trench lateral MOSFET 300b facing to the pair of trench lateral MOSFET's 300a are relaxed. Since the voltage of the region below pad opening 321 is kept around the drain voltage, the electric field applied to the interlayer insulation film is relaxed. Thus, a semiconductor device including lateral trench MOSFET's exhibiting a high breakdown voltage of several hundreds V is obtained without adding many manufacturing steps.

Although the invention has been described in connection with the preferred embodiments thereof, changes and modifications are obvious to those skinned in the art without departing from the gist of the invention. For example, the dimensions described in connection with the embodiments are exemplary and selected appropriately considering the specifications.

Since the breakdown voltage in the direction parallel to the short edge portions of the source region and the drain region, that is the breakdown voltage of the device, is unaffected adversely by the breakdown voltage in the long edge portions of the source region and the drain region according to the invention, the semiconductor device according to the invention facilitates reducing the tradeoff relation between the breakdown voltage of the device and the on-resistance per a unit area of the device and improving the avalanche withstanding capability thereof. Therefore, a semiconductor device, which includes trench lateral MOSFET's exhibiting a high breakdown voltage of several hundred volts, is obtained according to the invention without adding many manufacturing steps.

What is claimed is:

1. A semiconductor device comprising:
   a semiconductor substrate of a first conductivity type; and
   unit devices located in a surface portion of the semiconductor substrate;
   wherein each of the unit devices comprises:
      an oblong trench dug from the surface of the substrate;
      an oblong source region of a second conductivity type in the surface portion of the semiconductor substrate, the source region being spaced apart from the trench;
      an offset drain region of the second conductivity type formed along the surface of the substrate spaced apart from the source region, along a side wall of the trench and along a bottom wall of the trench;
      an oxide filling the trench;
      drain region of the second conductivity type in the surface portion of the semiconductor substrate facing to the source region across the trench;
      a gate insulation film on the surface portion of the semiconductor substrate between the source region and the offset drain region;
      a gate electrode on the gate insulation film;
      a source electrode connected electrically to the source region;
      a drain electrode connected electrically to the drain region;

wherein a direction along a long edge portion of the drain region in a planar layout of the semiconductor device is defined as a y-direction;

wherein a direction perpendicular to the y-direction in the planar layout of the semiconductor device is defined as an x-direction;

wherein the trench is extended in the y-direction from short edge portions, extending in the x-direction, of the drain region; and wherein the short edge portions, extending in the x-direction, of the drain region are surrounded by the offset drain region.

2. The semiconductor device according to claim 1, wherein the length of the offset drain region in the y-direction between the edge portion, extending in the x-direction, of the trench and the short edge portion, extending in the x-direction, of the drain region is longer than the length of the offset drain region in the x-direction between an adjacent pair of the trench in the planar layout of the semiconductor device.

3. The semiconductor device according to claim 2, wherein the semiconductor device further comprises a base region of the first conductivity type formed in the surface portion of the semiconductor substrate, and the base region surrounds the source region formed therein and the offset drain region in the planar layout of the semiconductor device.

4. The semiconductor device according to claim 3, wherein the base region comprises an oblong branch extended in the y-direction between the adjacent source regions of adjacent pairs of the unit devices; the edge portion, extending in the x-direction, of the distal end of the branch and the inner short edge portions, extending in the x-direction, of the adjacent gate electrodes of the adjacent pairs of the unit devices are surrounded by the offset drain region in the planar layout of the semiconductor device.

5. The semiconductor device according to claim 1, wherein the semiconductor device further comprises a base region of the first conductivity type formed in the surface portion of the semiconductor substrate, and the base region surrounds the source region formed therein and the offset drain region in the planar layout of the semiconductor device.

6. The semiconductor device according to claim 5, wherein the base region comprises an oblong branch extended in the y-direction between the adjacent source regions of adjacent pairs of the unit devices; the edge portion, extending in the x-direction, of the distal end of the branch and the inner short edge portions, extending in the x-direction, of the adjacent gate electrodes of the adjacent pairs of the unit devices are surrounded by the offset drain region in the planar layout of the semiconductor device.

7. A semiconductor device comprising:

a semiconductor substrate of a first conductivity type; and unit devices in the surface portion of the semiconductor substrate;

wherein each of the unit devices comprising:

a trench dug from the surface of the substrate, the trench being shaped as a rectangular ring and is shared by a pair of the unit devices;

a source region of a second conductivity type in the surface portion of the semiconductor substrate, the source region surrounding the trench, the source region being spaced apart from the trench;

a drain region of the second conductivity type in the surface portion of the semiconductor substrate surrounded by the trench;

an offset drain region of the second conductivity type formed along the surface of the substrate spaced apart from the source region, along the side wall of the trench and along the bottom wall of the trench, the offset drain region in contact with the drain region;

an oxide filling the trench;

a gate insulation film on the surface portion of the semiconductor substrate between the source region and the offset drain region;

a gate electrode on the gate insulation film;

a source electrode connected electrically to the source region; and a drain electrode connected electrically to the drain region;

wherein a direction along the long edge portion of the drain region in a planar layout of the semiconductor device is defined as a y-direction; a direction perpendicular to the y-direction in the planar layout of the semiconductor device is defined as an x-direction; and the trench is wider in the y-direction than in the x-direction.

8. The semiconductor device according to claim 7, wherein the semiconductor device further comprises a base region of the first conductivity type formed in the surface portion of the semiconductor substrate, and the base region surrounds the source region formed therein.

9. A semiconductor device comprising:

a semiconductor substrate of a first conductivity type; and unit devices in the surface portion of the semiconductor substrate;

wherein each of the unit devices comprising:

a trench dug from the surface of the substrate, the trench being shaped as a rectangular ring and is shared by a pair of the unit devices;

a source region of a second conductivity type in the surface portion of the semiconductor substrate, the source region surrounding the trench, the source region being spaced apart from the trench;

a drain region of the second conductivity type in the surface portion of the semiconductor substrate surrounded by the trench;

an offset drain region of the second conductivity type formed along the surface of the substrate spaced apart from the source region, along the side wall of the trench and along the bottom wall of the trench, the offset drain region in contact with the drain region;

an oxide filling the trench;

a gate insulation film on the surface portion of the semiconductor substrate between the source region and the offset drain region;

a gate electrode on the gate insulation film;

a source electrode connected electrically to the source region; and a drain electrode connected electrically to the drain region;

wherein a direction along a long edge portion of the drain region in the planar layout of the semiconductor device is defined as a y-direction; a direction perpendicular to the y-direction in a planar layout of the semiconductor device is defined as an x-direction; and the offset drain region is formed between the drain region and the trench in the y-direction in the planar layout of the semiconductor device.

10. The semiconductor device according to claim 9, wherein the length of the offset drain region between the drain region and the gate electrode is longer in the y-direction than in the x-direction.

11. The semiconductor device according to claim 10, wherein the semiconductor device further comprises a base region of the first conductivity type formed in the surface portion of the semiconductor substrate, and the base region surrounds the source region formed therein.

12. The semiconductor device according to claim 9, wherein the semiconductor device further comprises a base region of the first conductivity type formed in the surface portion of the semiconductor substrate, and the base region surrounds the source region formed therein.

* * * * *